(12) United States Patent
Meyer

(10) Patent No.: US 6,317,468 B1
(45) Date of Patent: Nov. 13, 2001

(54) IF EXCITER FOR RADIO TRANSMITTER

(75) Inventor: Ronald R. Meyer, Cedar Rapids, IA (US)

(73) Assignee: Rockwell Collins, Cedar Rapids, IA (US)

(*) Notice: Subject to any disclaimer, the term of this patent is extended or adjusted under 35 U.S.C. 154(b) by 0 days.

(21) Appl. No.: 09/099,020

(22) Filed: Jun. 17, 1998

(51) Int. Cl.[7] .............................. H03C 5/00; H03K 7/10; H03K 9/10
(52) U.S. Cl. ............................................. 375/269; 375/271
(58) Field of Search ................................. 375/308, 302, 375/303, 269, 271, 272, 279

(56) References Cited

U.S. PATENT DOCUMENTS

| | | | |
|---|---|---|---|
| 5,418,818 | * | 5/1995 | Marchetto et al. .................. 375/264 |
| 5,627,499 | * | 5/1997 | Gardner ............................... 332/101 |
| 5,701,106 | * | 12/1997 | Pikkarainen et al. .............. 332/100 |
| 6,111,531 | * | 8/2000 | Farag ................................... 341/143 |

OTHER PUBLICATIONS

A CMOS IF Transceiver with Reduced Analog Copmplexity by Tod Paulus et al.

* cited by examiner

*Primary Examiner*—Chi Pham
*Assistant Examiner*—Phuong Phu
(74) *Attorney, Agent, or Firm*—Nathan O. Jensen; Kyle Eppele

(57) ABSTRACT

A method and apparatus are provided for modulating an intermediate frequency of a radio frequency transmitter with a digital sample stream. The method includes the steps of interpolating the digital sample stream by an over sampling factor and modulating the interpolated digital sample stream to a single bit sample stream, while spreading and shaping quantization noise created by the modulation outside a bandwidth of the intermediate frequency. The method further includes the steps of converting the single bit sample stream to an analog signal and bandpass filtering the analog signal around the intermediate frequency.

24 Claims, 6 Drawing Sheets

IF EXCITER FOR RADIO TRANSMITTER

FIELD OF THE INVENTION

The field of the invention relates to radio frequency transmitters and more particularly to modulating an intermediate frequency of a radio frequency transmitter with an information signal.

BACKGROUND OF THE INVENTION

The use of intermediate frequencies (IF) in radio frequency (RF) transmitters and receivers is known. Typically an IF frequency is of a relatively constant frequency that varies only by a modulation level of an impressed information signal. In the case of a transmitter, the modulated IF frequency is shifted upwards to a final channel frequency by mixing the IF frequency with a variable frequency from a frequency synthesizer.

Philosophically, the greater the difference between the IF frequency and the final channel frequency, the easier it becomes to filter an information signal from other, unwanted artifacts. When an IF frequency is mixed with the final channel frequency, the result is a summation frequency and a difference frequency and multiples thereof (aliases). Most of the information energy lies in the summation and difference signals and typically one (or both) are amplified for transmission to a distant receiver. The aliases represent interference, both to the information signal and to information signals on adjacent channels and, consequently, must be filtered from the information signal before transmission.

When the difference between the IF frequency and final channel frequency is great, the difficulty of filtering the aliases from the information signal becomes much easier. As a consequence, an IF frequency is typically chosen to maximize the frequency difference between the IF frequency and any frequency the synthesizer may assume in transmitting on an assigned channel.

The information signal translated to an IF frequency may be analog or digital. Historically, the information signal has been analog, originating from such sources as microphones. Where the information signal is analog, the technology used for translation of the information signal to the IF frequency has included the use of mixers and filters.

More recent systems have used digital processing. Analog to digital converter (A/D) converters and digital signal processors (DSP) may be used to transform analog signals (e.g., from a microphone) into a digital format. The conversion to a digital format has also allowed computers to be used as sources of an information signal transferred over a radio frequency link.

The availability of digital signal processing has resulted in some simplification of signal processing hardware. For example, techniques have been developed which allow the generation of transmitted waveforms from a digital information source using waveform lookup tables. Multiplexers may be used to combine waveforms from the waveform tables to generate combinations of waveforms to simulate a variety of modulation levels.

Other techniques include interpolating digital signals and delta-sigma modulating an input driving digital to analog (D/A) converters to generate an IF waveform. Bandpass filters may be used to control aliasing of the digitally converted products.

In general, the generation of the IF signal inevitably involves modulation of a source information signal onto an IF reference frequency. IF exciters have been developed which rely on various mixing philosophies and phase change algorithms. While such methods have generally been effective, their effectiveness is dependent upon extensive filtering and the use of analog components having relatively precise tolerances. The introduction of digital techniques have generally not changed these requirements. Because of the importance of radio frequency communications, a need exists for a method of IF excitation that is not dependent upon the precise tolerances of analog signal generation and extensive filtering.

SUMMARY

A method and apparatus are provided for modulating an intermediate frequency of a radio transmitter with a digital sample stream. The method includes the steps of interpolating the digital sample stream by an over sampling factor and modulating the interpolated digital sample stream to a single bit sample stream, while spreading quantization noise created by the modulation outside a bandwidth of the intermediate frequency. The method further includes the steps of converting the single bit sample stream to an analog signal and bandpass filtering the analog signal around the intermediate frequency.

Use of the apparatus and method of the invention allows for the use of analog components with less precise tolerances. For instance, D/A converters with very low bit differentiation (e.g., one bit) becomes practical. Reducing the requirements for bit differentiation enhances integration of such signal processing devices (having N actual bits) into very large scale integrated (VLSI) circuits (having M effective bits) and eliminates the need for high precision "stairstep" M-bit D/A transfer functions (where N<<M).

The invention also allows for the use of analog devices with less precise tolerances. The filter cutoff frequencies of such devices may be reduced. The "brickwall" characteristics of filtering arrays may also be eliminated.

Further, the balance of the in-phase (I) and quadrature (Q) components under the invention may be regarded as substantially perfect. Prior state-of-the-art devices have required calibration to achieve a "good" balance, which is still not comparable to that offered under the invention. Further, calibration is not required under the invention.

Conventional digital modulation techniques require tight control of gain/phase processing to achieve good I, Q balance. This invention facilitates good overall system performance because of the inherent I, Q gain/phase balance. (Note that I, Q gain/phase imbalance acts to increase bit error rate (BER) in digital systems.)

DETAILED DESCRIPTION OF A PREFERRED EMBODIMENT

Figure 1:
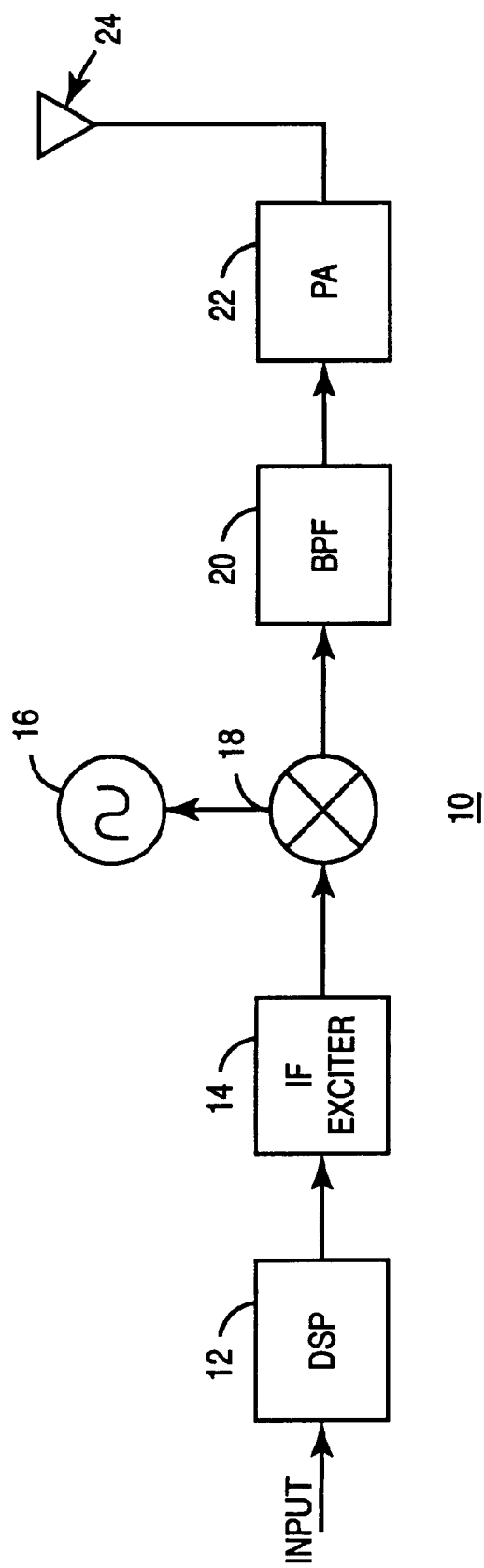
FIG. 1 is a block diagram of a radio transmitter and IF exciter in accordance with an embodiment of the invention.

FIG. 1 is a block diagram of a radio frequency transmitter 10 using an IF exciter 14 in accordance with an illustrated embodiment of the invention. Under the embodiment, the IF exciter 14 may receive a digital signal stream from a digital signal processor (DSP) 12, modulate the signal stream onto an intermediate frequency and provide the modulated IF frequency for mixing to a channel frequency within a mixer 18.

The DSP 12 of FIG. 1 may receive the digital signal stream from a microphone (not shown) through an analog to digital converter (also not shown). The DSP 12 may function to process the digital signal stream into an appropriately encoded digital format (e.g., pulse coded modulation (PCM)) and transfer the result of such encoding operation to the IF exciter 14.

Alternatively, the DSP 12 may receive the signal stream from another digital computer (not shown). The digital signal stream may be a file transfer or control characters provided under an appropriate format.

The IF frequency (FIG. 4) may be located in any convenient spectral location, sufficiently remote from either the information signal or final channel frequency. For instance, where the final channel frequency is in the cellular range (e.g., 900 MHZ), the IF frequency may be chosen in the area of 90 MHZ. Maintaining a ratio of 10:1 between the IF and final channel frequency functions to help reduce interference by ensuring that any aliasing from signal processing will lie outside information processing zones.

Within the mixer 18, the IF frequency is mixed with a channel frequency from a programmable oscillator 16, bandpass filtered in BFP 20 and provided as an input to a power amplifier 22. Within the PA 22 the filtered channel signal is raised to an appropriate power level and transmitted through an antenna 24.

Figure 2:
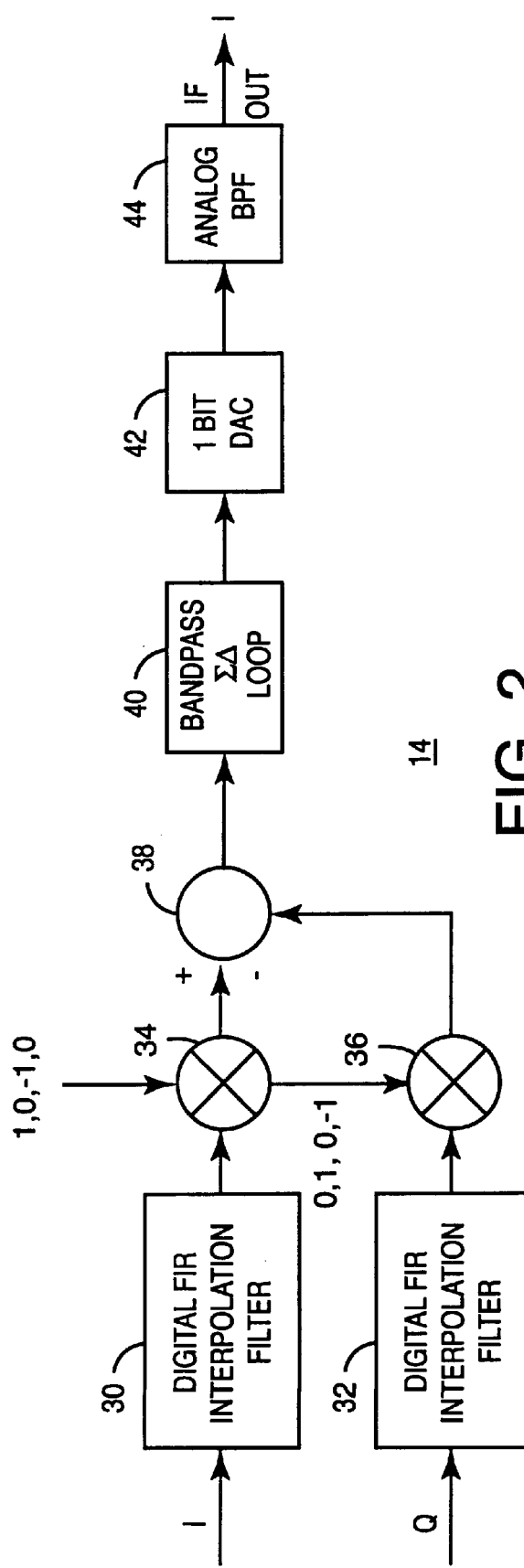
FIG. 2 is a block diagram of the IF exciter of FIG. 1.
Figure 5:
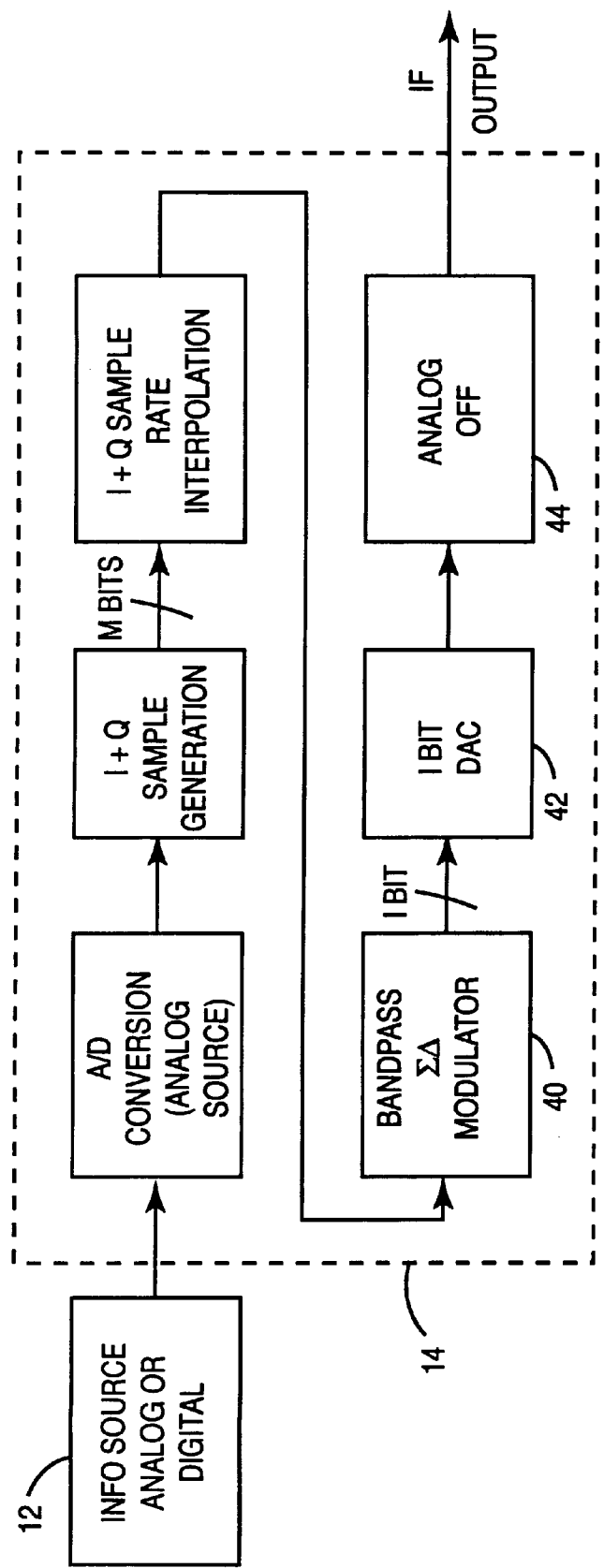
FIG. 5 depicts a more detailed view of elements of FIG. 1.

FIG. 2 and FIG. 5 are block diagrams of the IF exciter 14. While FIG. 2 shows an IF exciter 14 capable of accepting inputs, I and Q, it is understood that the exciter 14 would function equally well with a single input.

Inputs I and Q from the DSP 12 may be a stream of digital sample inputs of N bits per sample. The rate of input of the sample stream may be determined by a bandwidth of a signal source under the Nyquist criteria. The determined bandwidth may be predetermined by the application (e.g., file transfers from another computer) or determined by the DSP 12 (e.g., where the information stream originates from a stereo source).

As shown in FIG. 2, the IF exciter 14 accepts I and Q samples and interpolates the samples to a much higher sample rate in the digital finite impulse response (FIR) interpolation filters 30, 32. The interpolated sample streams are alternately selected in multipliers 34, 36 and multiplexed into a single sample stream within an adder 38. The multiplexed sample stream may then be sigma-delta modulated within the bandpass $\Sigma\Delta$ loop 40 to a one-bit (per sample) sample stream. A one-bit digital to analog (D/A) converter 42 converts the single bit sample stream into an analog signal which may then be bandpass filtered in the analog BPF 44.

Within the interpolation filters 30, 32, successive multi-bit samples (e.g., 11 bits) may be subjected to an over sampling algorithm that steps up the number of samples per time period by an over sampling ratio (OSR). As will be explained later, over sampling functions to spread the quantization noise generated over a greater bandwidth within the bandpass $\Sigma\Delta$ loop 40.

Figure 6A:
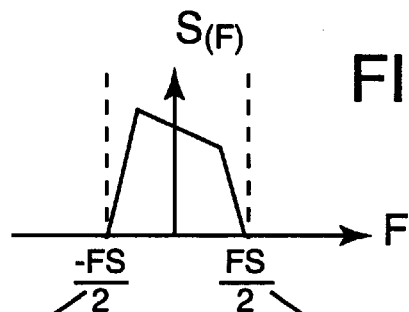
FIGS. 6a–b depict signal processing characteristics of the interpolation filters of FIG. 1.
Figure 6B:
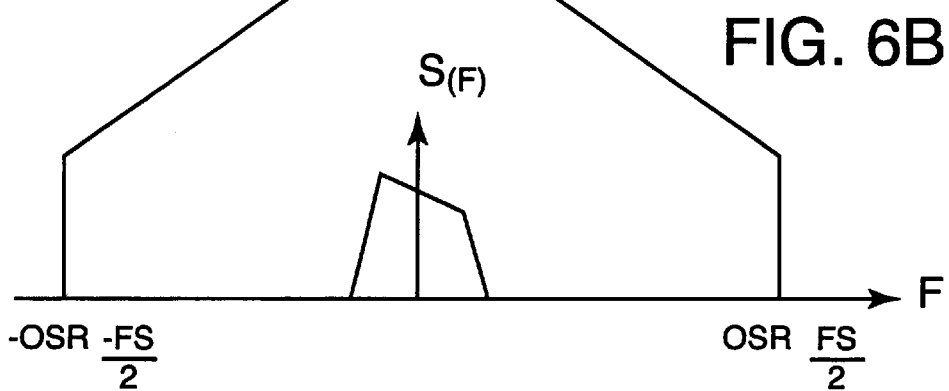

As is known, a random stream of bits of an information signal may look somewhat like white noise. Modulating an IF carrier with the raw bit stream would cause interference, so it is filtered. The bit stream is filtered by interpolation (FIGS. 6a–b). The bit stream is interpolated by inserting N−1 zeros in the data stream to interpolate by N. This does two things: it makes the data look more like impulses, and it interpolates the bit stream to a higher level clocking state.

Increasing the clocking state of the information signal is important because of the need to match a clocking rate of the information signal to the delta-sigma modulator 40 used in conjunction with the DAC 42. Failure to match the clocking rates would cause aliases that would require additional processing steps.

Over sampling (interpolation) may be accomplished using any of a number of prior art techniques. For instance, cascaded integrated comb (CIC) filtering may be used within the interpolation filters 30, 32. As used herein, the interpolation filters 30, 32 may increase the number of samples by an average of two (or more) orders of magnitude.

For instance, a voice signal of 4 kHz would require a Nyquist sampling rate of 8 kHz. A sampling rate required by the bandpass $\Sigma\Delta$ loop 40 may be 20 MHZ. In this example, an OSR in excess of three orders of magnitude would be required.

Figure 7:
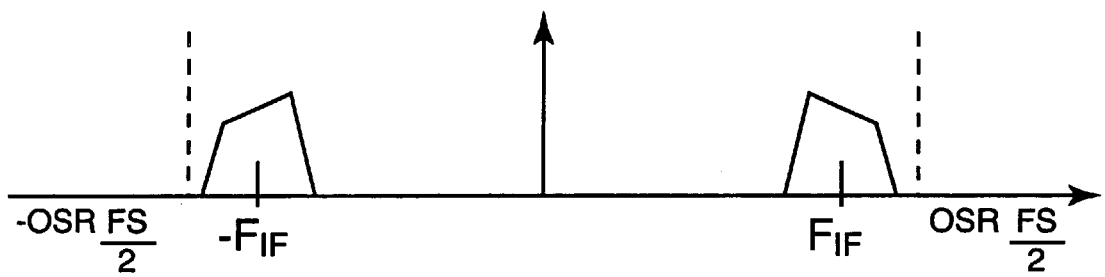
FIG. 7 depicts signal characteristics of an input of the sigma-delta loop.

At this point the baseband signal has been interpolated up to the same clock rate as the loop 40. The baseband carriers I and Q may now be multiplied with the carriers and added together. Multiplication occurs with a set of multipliers 34, 36. Within the multipliers 34, 36, the I and Q components are multiplied by in-phase and quadrature components of the IF carrier frequency. I is multiplied by an in-phase component (represented by 1, 0, −1, 0) in a first multiplier 34. Q is multiplied by a quadrature component (represented by 0, 1, 0, −1) in a second multiplier 36. The result of the summation of multiplied signals is shown in FIG. 7.

Multiplying the two signals together in an I an Q mixing stage (e.g., in a quadrature multiplier) involves a complex multiplication. Because only the real part can be transmitted, I*cos-Q*sin is what remains. For example, the nth sample transmitted is $$I(n)*\cos[2\pi f_{IF}n/(f_s*OSR)]-Q(n)\sin[2\pi f_{IF}n/(f_s*OSr)].$$

In FIG. 2, $f_{IF}=\frac{1}{4}$ fs*OSR, and the sin and cos functions reduce to:

$$\cos(\pi n/2)=1, 0, -1, 0 \ldots$$

$$\sin(\pi n/2)=0, 1, 0, -1 \ldots$$

for n=0, 1, 2 . . .

Figure 3:
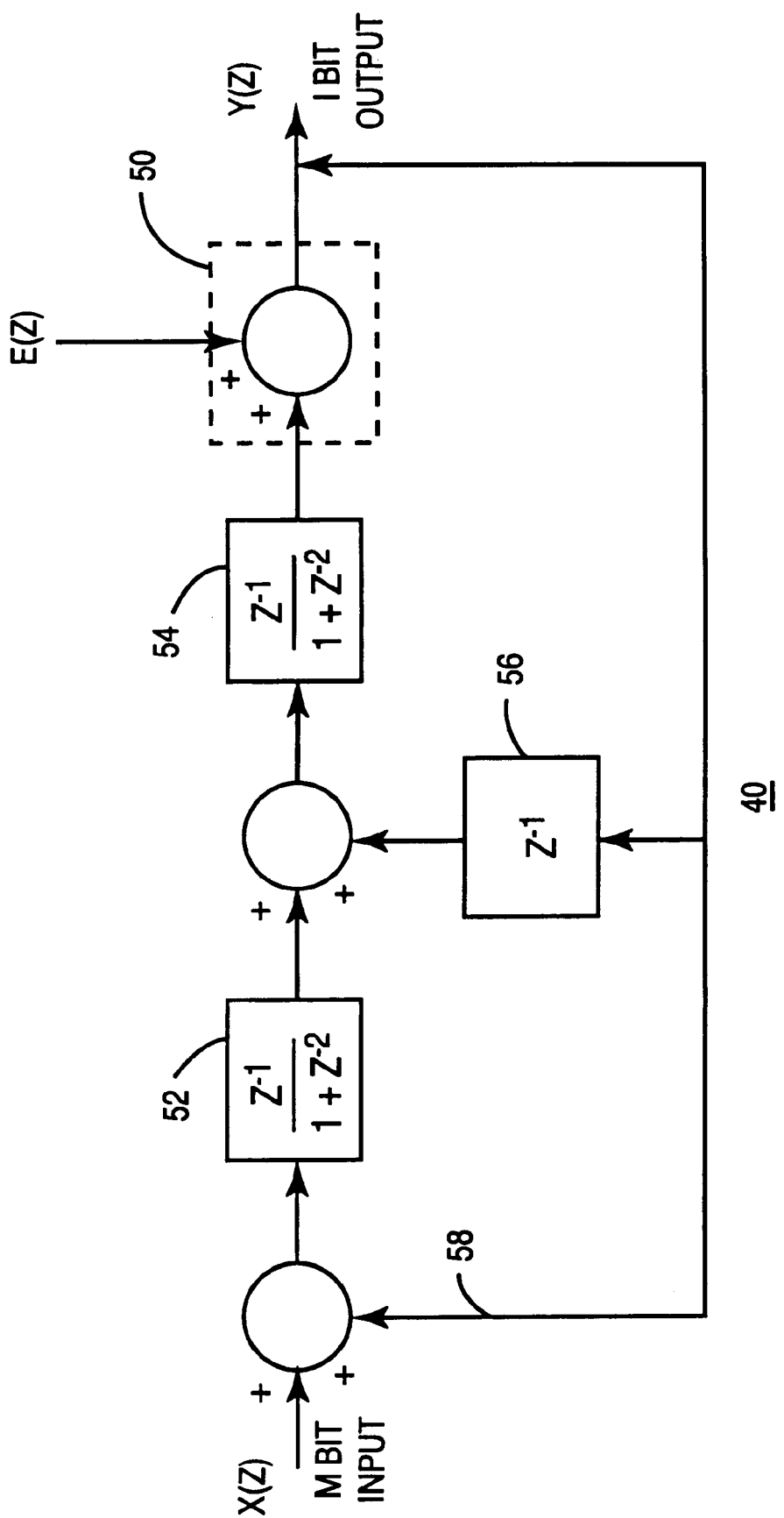
FIG. 3 is a schematic of the bandpass $\Sigma\Delta$ loop of FIG. 2.

FIG. 3 is a block diagram of the bandpass $\Sigma\Delta$ loop 40. As shown, the bandpass $\Sigma\Delta$ loop 40 may be implemented as a fourth order sigma-delta modulator. The transfer function for the bandpass $\Sigma\Delta$ loop 40 may be described by the equality $$Y(z)=z^{-2}X(z)+(1+z^{-2})^2 e(z),$$

where:

Y(z)=z domain output of loop 40,

X(z)=z domain input to loop 40, and e(z)=z domain quantization error from 1 bit quantizer 50.

Within the bandpass $\Sigma\Delta$ loop 40, the multibit digital words are quantized to a single bit by the quantizer 50. The single bit output of the bandpass $\Sigma\Delta$ loop 40 is then provided as an input to the DAC 42.

By the appropriate selection of feedforward 52, 54 and feedback 56, 58 components of the bandpass $\Sigma\Delta$ loop 40 (as shown in FIG. 3) and operating parameters, the bandpass ΣΔ loop 40 may be used to spread and shape the quantization noise generated by operation of the bandpass ΣΔ loop 40 to spectral areas outside the passband of the BPF 44 (e.g., to areas greater than 0.5 MHZ from the center frequency).

Figure 4:
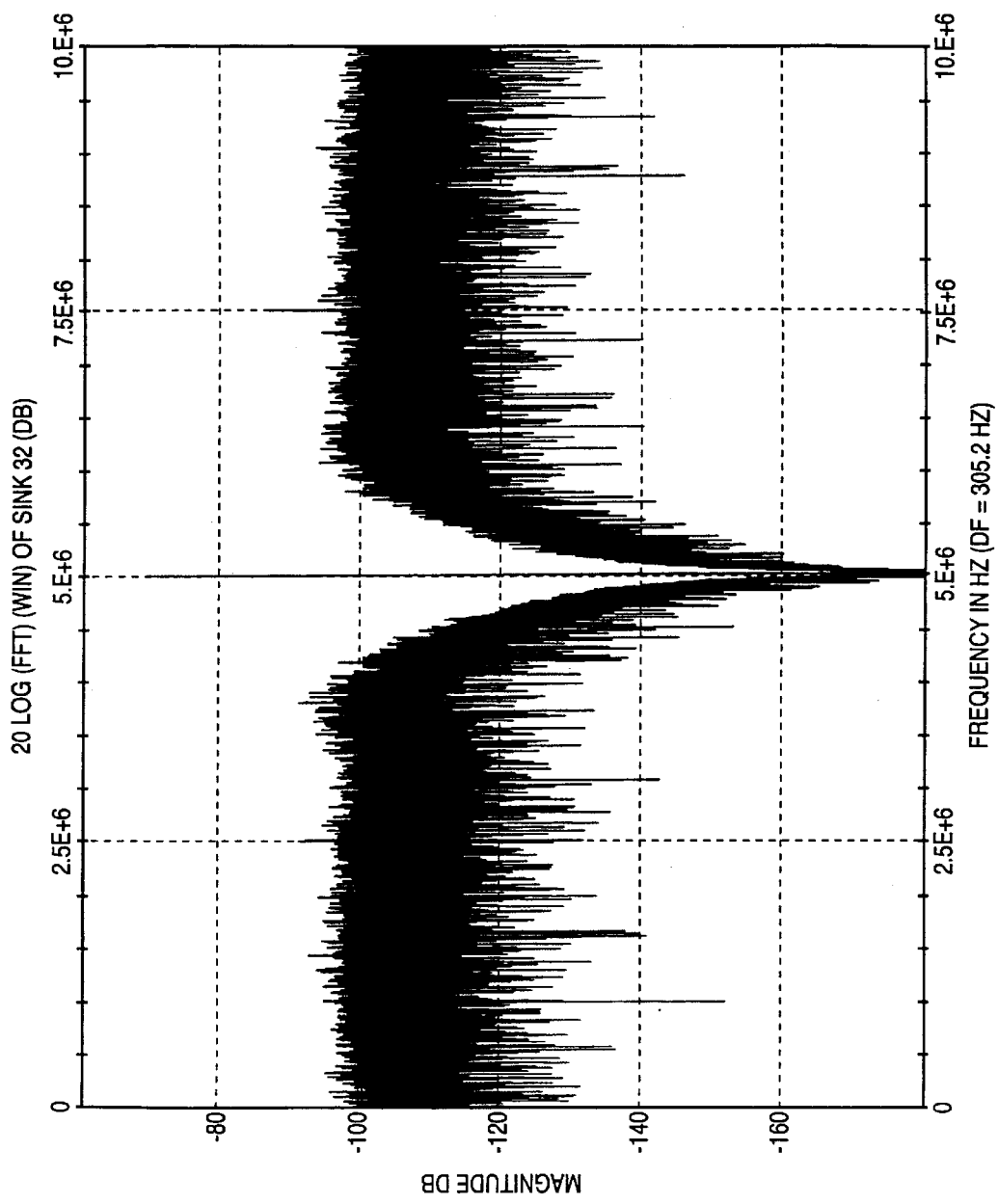
FIG. 4 depicts a simulation of noise performance of the IF exciter of FIG. 2.

In the z domain, the operation of the ΣΔ loop 40 may be described by the equation as follows:

$$Y(z)=X(z)STF(z)+e(z)NTF(z),$$

where $Y(z)$ is the output of the ΣΔ loop 40, $X(z)$ is the information signal input, STF is the signal transfer function and NTF is the noise transfer function. It has been determined that by selecting an interpolation sample rate (e.g., 20 MHz) of four times an unmodulated IF frequency (e.g., 5 MHz), The quantization noise $e(z)$ may be spread and shaped by $NTF(z)$ to an area outside of the passband of the IF frequency, as shown in FIG. 4. The NTF has a value of $(1+z^{-2})$ and has a magnitude of zero at an IF of one-fourth the sampling rate.

Causing the IF exciter 14 to operate with a second term of the transfer function equal to zero results in considerable simplification in the digital processing load experienced by the IF exciter 14. The simplification results from the noise-shaping which moves the quantization noise $e(z)$ away from the information signal $X(z)$. Moving the quantization noise away from the information signal input reduces the processing burden associated with removing that noise $e(z)$ from the IF.

Further, the spreading of the one-bit quantization noise $e(z)$ shaped by the bandpass ΣΔ loop 40 allows out-of-band noise regions of $e(z)$ to be removed by low cost analog filters (e.g., surface acoustic wave (SAW) filters). FIG. 4 is a simulation of noise distribution of the IF exciter 14 operating with an interpolation sample rate of four times the IF frequency.

The benefits of the IF exciter 14 is achieved by replacing the close tolerance elements required by analog components of prior art devices with digital processing elements and a low tolerance analog reconstruction filter. Further, the use of digital processing in the I and Q mixing stages (34, 36, 38) eliminates any problem of balancing the levels of quadrature components. The substantially perfect balance of the I and Q components is achieved by the inherent quantization stabilization inherent in digital processing. The effective resolution of the D/A 42 may be further increased by increasing the loop order, over sampling ratio (OSR) and/or cascading stages.

Further, the selection of the interpolation frequency of four times the IF frequency results in considerable simplification of the hardware of the quadrature multipliers 34, 36 and adder 38. For instance, the four times sampling rate allows a simple sine/cosine function to be used in the quadrature multipliers 34, 36. The use of sine/cosine functions results, in effect, in a simple multiplexing of alternate I and Q samples into the bit stream entering the bandpass ΣΔ loop 40.

A specific embodiment of a method and apparatus of providing an IF exciter according to the present invention has been described for the purpose of illustrating the manner in which the invention is made and used. It should be understood that the implementation of other variations and modifications of the invention and its various aspects will be apparent to one skilled on the art, and that the invention is not limited by the specific embodiments described. Therefore, it is contemplated to cover the present invention any and all modifications, variations, or equivalents that fall within the true spirit and scope of the basic underlying principles disclosed and claimed herein.

What is claimed is:

1. A method of modulating an intermediate frequency of a radio frequency transmitter with a digital sample stream, such method comprising the steps of:

interpolating the digital sample stream by an over sampling factor;

modulating the interpolated digital sample stream to a single bit sample stream, while spreading and shaping quantization noise created by the modulation outside a bandwidth of the intermediate frequency;

converting the single bit sample stream to an analog signal; and bandpass filtering the analog signal around the intermediate frequency.

2. The method of modulating an intermediate frequency of a radio frequency transmitter as in claim 1 further comprising selecting an interpolation sample rate of substantially four times an unmodulated frequency of the intermediate frequency.

3. The method of modulating an intermediate frequency of a radio frequency transmitter as in claim 1 further comprising selecting an interpolation sample rate of substantially two orders of magnitude higher than a Nyquist frequency of an audio source of the digital sample stream.

4. The method of modulating an intermediate frequency of a radio frequency transmitter as in claim 1 wherein the step of modulating the interpolated digital sample stream further comprises sigma-delta modulating the interpolated digital sample stream.

5. The method of modulating an intermediate frequency of a radio frequency transmitter as in claim 1 wherein the step of modulating the interpolated digital sample stream further comprises sigma-delta modulating the interpolated digital sample stream using a fourth order sigma-delta modulator.

6. The method of modulating an intermediate frequency of a radio frequency transmitter as in claim 1 wherein the step of interpolating the digital sample stream further comprises interpolating an I and a Q sample stream.

7. The method of modulating an intermediate frequency of a radio frequency as in claim 6 further comprises multiplying the interpolated I and Q sample streams by in-phase and quadrature components of a reference signal having a frequency substantially equal to an unmodulated frequency of the intermediate frequency.

8. The method of modulating an intermediate frequency of a radio frequency transmitter as in claim 7 further comprising summing the multiplied I and Q sample streams.

9. Apparatus for modulating an intermediate frequency of a radio frequency transmitter with a digital sample stream, such apparatus comprising:

means for interpolating the digital sample stream by an over sampling factor;

means for modulating the interpolated digital sample stream to a single bit sample stream, while spreading and shaping quantization noise created by the modulation outside a bandwidth of the intermediate frequency;

means for converting the single bit sample stream to an analog signal; and means for bandpass filtering the analog signal around the intermediate frequency.

10. The apparatus for modulating an intermediate frequency of a radio frequency transmitter as in claim 9 further comprising means for selecting an interpolation sample rate of substantially four times an unmodulated frequency of the intermediate frequency.

11. The apparatus for modulating an intermediate frequency of a radio frequency transmitter as in claim 9 further comprising means for selecting an interpolation sample rate of substantially two orders of magnitude higher than a Nyquist frequency of an audio source of the digital sample stream.

12. The apparatus for modulating an intermediate frequency of a radio frequency transmitter as in claim 9 wherein the means for modulating the interpolated digital sample stream further comprises a sigma-delta modulator that modulates the interpolated digital sample stream.

13. The apparatus for modulating an intermediate frequency of a radio frequency transmitter as in claim 9 wherein the means for modulating the interpolated digital sample stream further comprises a fourth order sigma-delta modulator.

14. The apparatus for modulating an intermediate frequency of a radio frequency transmitter as in claim 9 wherein the means for interpolating the digital sample stream further comprises means for interpolating an I and a Q sample stream.

15. The apparatus for modulating an intermediate frequency of a radio frequency transmitter as in claim 14 further comprises means for multiplying the interpolated I and Q sample streams by in-phase and quadrature components of a reference signal having a frequency substantially equal to an unmodulated frequency of the intermediate frequency.

16. The apparatus for modulating an intermediate frequency of a radio frequency transmitter as in claim 15 further comprising means for summing the multiplied I and Q sample streams.

17. Apparatus for modulating an intermediate frequency of a radio frequency transmitter with a digital sample stream, such apparatus comprising:

an interpolator that interpolates the digital sample stream by an over sampling factor;

a modulator that modulates the interpolated digital sample stream to a single bit sample stream, while spreading and shaping quantization noise created by the modulation outside a bandwidth of the intermediate frequency;

a digital to analog converter that converts the single bit sample stream to an analog signal; and a bandpass filter that bandpass filters the analog signal around the intermediate frequency.

18. The apparatus for modulating an intermediate frequency of a radio frequency transmitter as in claim 17 wherein the interpolator operates at an interpolation sample rate of substantially four times an unmodulated frequency of the intermediate frequency.

19. The apparatus for modulating an intermediate frequency of a radio frequency transmitter as in claim 17 wherein the interpolator operates at an interpolation sample rate of substantially two order of magnitude higher than a Nyquist frequency of an audio source of the digital sample stream.

20. The apparatus for modulating an intermediate frequency of a radio frequency transmitter as in claim 17 wherein the modulator that modulates the interpolated digital sample stream further comprises a sigma-delta modulator that modulates the interpolated digital sample stream.

21. The apparatus for modulating an intermediate frequency of a radio frequency transmitter as in claim 20 wherein the sigma-delta modulator further comprises a fourth order sigma-delta modulator.

22. The apparatus for modulating an intermediate frequency of a radio frequency transmitter as in claim 17 wherein the interpolator which interpolates the digital sample stream further comprises a first and second interpolator which interpolates an I and a Q sample stream.

23. The apparatus for modulating an intermediate frequency of a radio frequency transmitter as in claim 22 further comprising a first and second multiplier that multiply the I and Q sample streams by in-phase and quadrature components of a reference signal having a frequency substantially equal to an unmodulated frequency of the intermediate frequency.

24. The apparatus for modulating an intermediate frequency of a radio frequency transmitter as in claim 23 further comprising an adder which sums the multiplied I and Q sample streams.

* * * * *